(12) United States Patent
Tofigh et al.

(10) Patent No.: US 8,988,912 B2
(45) Date of Patent: Mar. 24, 2015

(54) SYSTEM AND METHOD FOR EMULATING AN IDEAL DIODE IN A POWER CONTROL DEVICE

(75) Inventors: Farshid Tofigh, Mission Viejo, CA (US); Otmar Kruppa, Deiningen (DE)

(73) Assignee: Leach International Corporation, Buena Park, CA (US)

( * ) Notice: Subject to any disclaimer, the term of this patent is extended or adjusted under 35 U.S.C. 154(b) by 1332 days.

(21) Appl. No.: 12/257,341

(22) Filed: Oct. 23, 2008

(65) Prior Publication Data

US 2010/0103709 A1 Apr. 29, 2010

(51) Int. Cl.
| | |
|---|---|
| *H02M 7/217* | (2006.01) |
| *H03H 11/46* | (2006.01) |
| *H03K 17/30* | (2006.01) |

(52) U.S. Cl.
CPC .............. *H02M 7/217* (2013.01); *H03H 11/46* (2013.01); *H03K 17/302* (2013.01); *H03K 2017/307* (2013.01)
USPC ........................................................ 363/127

(58) Field of Classification Search
USPC ................................... 323/282–285; 363/127
See application file for complete search history.

(56) References Cited

U.S. PATENT DOCUMENTS

| | | | |
|---|---|---|---|
| 4,678,947 A | 7/1987 | Huijsing et al. | |
| 4,866,591 A | 9/1989 | Cook et al. | |
| 5,134,321 A | 7/1992 | Mehta | |
| 5,237,606 A | 8/1993 | Ziermann | |
| 6,060,943 A | 5/2000 | Jansen | |
| 6,243,278 B1 | 6/2001 | Jacobs | |
| 6,256,213 B1 | 7/2001 | Illingworth | |
| 6,396,333 B2 | 5/2002 | Dubhashi et al. | |
| 6,469,564 B1 * | 10/2002 | Jansen | 327/365 |
| 6,563,293 B2 * | 5/2003 | Marino et al. | 323/272 |
| 6,902,837 B2 | 6/2005 | McCluskey et al. | |
| 7,061,733 B2 * | 6/2006 | Canova et al. | 361/18 |
| 7,123,490 B2 | 10/2006 | Amei | |

(Continued)

FOREIGN PATENT DOCUMENTS

| | | |
|---|---|---|
| CN | 1297613 A | 5/2001 |
| CN | 1619934 A | 5/2005 |

(Continued)

OTHER PUBLICATIONS

International Search Report for Application No. PCT/US08/081034 filed Oct. 23, 2008, dated Dec. 4, 2008, mailed Feb. 5, 2009, 2 pages.

(Continued)

*Primary Examiner* — Jue Zhang
(74) *Attorney, Agent, or Firm* — Christie, Parker & Hale, LLP (57) ABSTRACT

A system and method for emulating an ideal diode for use in a power control device is provided. In one embodiment, the invention relates to a circuit for emulating an ideal diode, the circuit including at least one field effect transistor including a source, a drain, a gate, and a body diode, an input; an output coupled to the drain, a control circuit including a current sensor coupled between the input and the source, and a control circuit output coupled to the gate, wherein the control circuit is configured to activate the at least one field effect transistor based on whether the current flowing into the source is greater than a predetermined threshold, and wherein the body diode comprises an anode coupled to the source and a cathode coupled to the drain.

25 Claims, 8 Drawing Sheets

(56) References Cited

U.S. PATENT DOCUMENTS

| | | |
|---|---|---|
| 7,262,977 B2 | 8/2007 | Kyono |
| 7,330,046 B2 * | 2/2008 | Durbaum ................. 324/762.09 |
| 7,400,065 B2 | 7/2008 | Michalko |
| 2004/0000878 A1 | 1/2004 | Petruska et al. |
| 2005/0122753 A1 * | 6/2005 | Soldano ........................ 363/125 |
| 2005/0140334 A1 | 6/2005 | Tamai et al. |
| 2006/0061337 A1 * | 3/2006 | Kim et al. .................... 323/205 |
| 2006/0200688 A1 | 9/2006 | Tofigh et al. |
| 2007/0018502 A1 | 1/2007 | Bazinet |
| 2008/0067989 A1 | 3/2008 | Kasai et al. |

FOREIGN PATENT DOCUMENTS

| | | |
|---|---|---|
| CN | 101194217 A | 6/2008 |
| JP | 2001-238454 | 8/2001 |
| JP | 2002-026067 | 1/2002 |
| JP | 2002-511692 | 4/2002 |
| JP | 2005-198375 | 7/2005 |
| JP | 2006-502690 | 1/2006 |
| JP | 2008-67559 | 3/2008 |
| JP | 2008-72873 | 3/2008 |
| JP | 2008-154377 | 7/2008 |
| WO | WO 99/53618 | 10/1999 |
| WO | WO 2004/034439 A2 | 4/2004 |

OTHER PUBLICATIONS

Written Opinion for Application No. PCT/US08/081034 filed Oct. 23, 2008, dated Dec. 4, 2008, mailed Feb. 5, 2009, 5 pages.

"Synchronous rectification"; http://en.wikipedia.org/wiki/Synchronous_rectification; dated Jul. 29, 2008; 2 pages.

Chinese Office Action dated May 6, 2013 for corresponding Chinese Patent Application No. 200880132501.8 and English translation, 25 pgs.

Chinese Office Action dated Jan. 2, 2014 for corresponding Chinese Patent Application No. 200880132501.8 and English translation, 31 pgs.

Chinese Office Action dated May 13, 2014 for corresponding Chinese Patent Application No. 200880132501.8 and English translation, 31 pgs.

English translation of Japanese Office Action dated May 16, 2013 for corresponding Japanese Application No. 2011-533148, 6 pgs.

English translation of Japanese Office Action dated Mar. 12, 2014 for corresponding Japanese Application No. 2011-533148, 4 pgs.

Japanese Office Action dated Sep. 9, 2014 for corresponding Japanese Patent Application No. 2013-187944, and English translation, 10 pages.

* cited by examiner

SYSTEM AND METHOD FOR EMULATING AN IDEAL DIODE IN A POWER CONTROL DEVICE

BACKGROUND OF THE INVENTION

The present invention relates to a system and method for emulating an ideal diode for use in a power control device. More specifically, the present invention relates to a system and method for controlling a transistor to emulate an ideal diode.

Conventional diodes are used in any number of applications, and, more specifically, in applications involving rectification. For example, diodes are often used in power conversion systems to convert alternating current into direct current, for over voltage protection, and for blocking reverse currents in systems having multiple power sources (e.g., an uninterruptible power source). The voltage drop across a conventional diode and corresponding power dissipation are generally thought of as being relatively small values. However, power conversion systems typically include high frequency conversion and losses due to diode power dissipation can therefore become substantial. In such case, conventional diodes can be inefficient as compared to diodes having approximately ideal characteristics (e.g., negligible voltage drop).

Theoretical ideal diodes possessing certain preferred characteristics have been proposed. Such theoretical ideal diodes would behave like a short circuit when forward biased and like an open circuit when reverse biased. That is, an ideal diode would dissipate no power in either direction. Empirically no such ideal diode exists, however, approximating such ideal behavior would provide significant benefits related to efficiency and circuit performance.

The actual voltage drop and consequent power dissipation across conventional diodes used in power conversion systems can be substantial under high current conditions. In some cases, the voltage drop across a single diode can be as high as 1.2 volts. In some power conversion applications, the current through a diode can vary from 50 to 400 amps. For a diode with a voltage drop of 1.2 volts carrying 400 amps, 480 watts of power are dissipated. Such large scale power dissipation can adversely affect the reliability of electronics used within or in conjunction with the power conversion system. In some circumstances, for example, such dissipation requires use of a substantial heat sink. Accordingly, the voltage drop across a diode greatly influences efficiency and can require specialized components to dissipate the substantial heat generated.

SUMMARY OF THE INVENTION

Aspects of the invention relate to a system and method for emulating an ideal diode for use in a power control device. In one embodiment, the invention relates to a circuit for emulating an ideal diode, the circuit including at least one field effect transistor including a source, a drain, a gate, and a body diode, a current sensor configured to measure the current flowing into the source of each of the at least one field effect transistor and to generate a voltage corresponding to the measured current, a comparator including a first input and a second input coupled to the current sensor and an output coupled to the gate of each of the at least one field transistor, and a status reporting circuit coupled to the comparator, wherein the comparator is configured to activate the at least one field effect transistor when the voltage generated by the current sensor is is greater a predetermined threshold, wherein the status reporting circuit is configured to monitor a voltage of the output of the comparator and to generate a signal indicative of whether the plurality of field effect transistors are activated or deactivated based on the monitored voltage, and wherein the body diode comprises an anode coupled to the source and a cathode coupled to the drain.

In another embodiment, the invention relates to a circuit for emulating an ideal diode, the circuit including at least one field effect transistor including a source, a drain, a gate, and a body diode, an input, an output coupled to the drain, a control circuit including a current sensor configured to measure the current flowing into the source, and a comparator coupled to the gate, and a status reporting circuit coupled to the comparator, wherein the comparator is configured to activate the at least one field effect transistor when the measured current flowing into the source is greater than a predetermined threshold, wherein the status reporting circuit is configured to monitor an output voltage of the control circuit and to generate a signal indicative of whether the at least one field effect transistor is activated or deactivated based on the monitored output voltage, and wherein the body diode comprises an anode coupled to the source and a cathode coupled to the drain.

In yet another embodiment, the invention relates to a power system including a transformer rectification unit, the power system including an alternating current power source coupled to the transformer rectification unit, a direct current load coupled to the transformer rectification unit, the transformer rectification unit including a primary winding, a secondary winding in electromagnetic communication with the primary winding, and at least one ideal diode circuit coupled to the secondary winding, the at least one ideal diode circuit including a current sensor, a comparator, and at least one field effect transistor coupled to the comparator, and a status reporting circuit coupled to the comparator, wherein the at least one field effect transistor is configured to rectify energy from the alternating current power source by dissipating energy across a body diode of the at least one field effect transistor, and wherein the current sensor is configured to measure the current flowing into a source of the at least one field effect transistor, wherein the comparator is configured to activate the at least one field effect transistor when the measured current flowing into the source is greater than a predetermined threshold, and wherein the status reporting circuit is configured to monitor an output voltage of the control circuit and to generate a signal indicative of whether the at least one field effect transistor is activated or deactivated based on the monitored output voltage.

BRIEF DESCRIPTION OF THE DRAWINGS

FIG. 4(1)-4(2) is a schematic diagram of an ideal diode control circuit configured to measure current, control an ideal diode circuit, report status, and provide a force-on capability in accordance with an embodiment of the present invention.

FIG. 5(1)-5(3) is a schematic diagram of an ideal diode control circuit configured to measure current, report the measured current, control an ideal diode circuit, report control status, and provide a force-off capability in accordance with an embodiment of the present invention.

DETAILED DESCRIPTION OF THE INVENTION

Embodiments of ideal diode circuits include transistors coupled to control circuits. The transistors are configured to operate as a diode or unidirectional switch having characteristics approximating a theoretical ideal diode. The control circuits can detect current flow into the ideal diode circuit. Based on the detected current, the control circuits can activate (turn on) or deactivate (turn off) the transistors. Activation of the transistors minimizes the voltage drop across the ideal diode circuit, while deactivation of the transistors effectively prevents current flow in a reverse direction.

In one embodiment, the transistor is a field effect transistor (FET) and the control circuit measures voltage at both the source and drain of the FET. In such case, if the voltage at the source is higher than the voltage at the drain by a predetermined threshold, the control circuit can activate the FET to enable minimal voltage drop across the ideal diode circuit. Alternatively, if the voltage at the drain is higher than the voltage at the source, the control circuit can deactivate the FET for high impedance in the reverse direction (e.g., from drain to source) like a conventional diode.

In some embodiments, the ideal diode circuits include a number of transistors coupled in parallel to increase the current carrying capability and to further reduce the voltage drop of the ideal diode circuit. In one embodiment, the ideal diode circuits include an override or force-on capability which enables an external system to force the transistor into the on-state. In another embodiment, the ideal diode circuits include a disable or force-off capability which enables an external system to force the transistor into the off-state. In a number of embodiments, the ideal diode circuit includes a status reporting circuit for reporting the state or status (e.g., on-state or off-state) of the transistor(s) of the ideal diode circuit. In some embodiments, the ideal diode circuit reports status including a magnitude of current passing through the ideal diode(s). In another embodiment, several ideal diode circuits are incorporated within a Transformer Rectifier Unit (TRU) for converting alternating current (AC) to direct current (DC). TRUs are commonly used in aircraft electrical systems to convert AC power from generators to DC power for various devices, including, for example, batteries for supplying backup or emergency power. The ideal diode circuits enable highly efficient rectification within the TRU.

Figure 1:
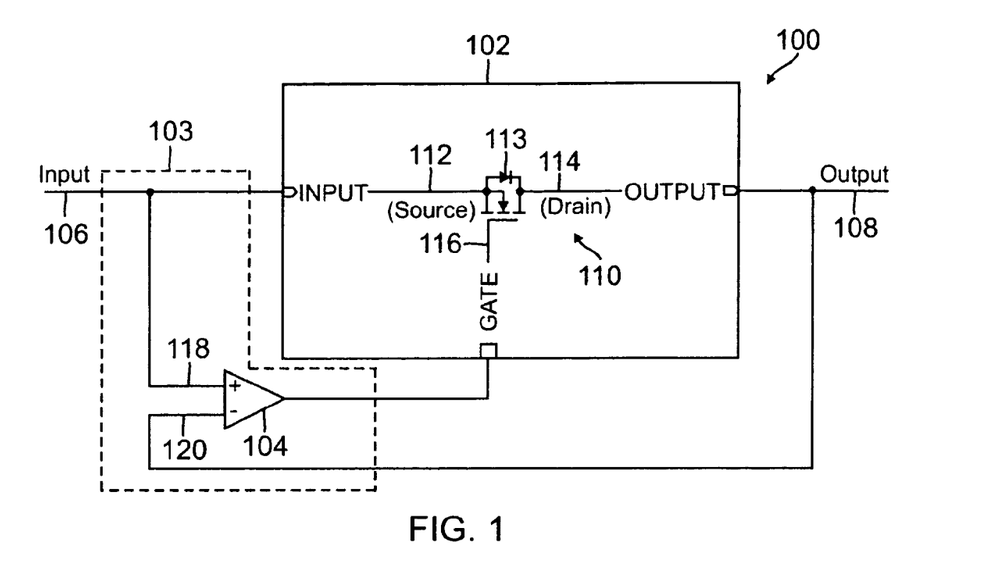
FIG. 1 is a schematic diagram of an ideal diode circuit including a Field Effect Transistor (FET) and a comparator for controlling the FET in accordance with an embodiment of the present invention.

FIG. 1 is a schematic diagram of an ideal diode circuit 100 including a field effect transistor (FET) 110 and a comparator 104 for controlling the FET in accordance with an embodiment of the present invention. The ideal diode circuit 100 also includes an input 106 for receiving a current at a first voltage and an output 108 for providing the current at a second voltage. A first input 118 of the comparator 104 is coupled to the input 106 of the ideal diode circuit 100 and a second input 120 of the comparator 104 is coupled to the output 108 of the ideal diode circuit 100. An output of the comparator 104 is coupled to the gate 116 of the transistor 110. The FET 110 includes a source 112 coupled to the input 106, a drain 114 coupled to the output 108 of the ideal diode circuit, and a body diode 113 having an anode coupled to the source 112 and a cathode coupled to the drain 114.

In operation, the comparator generates an output signal indicative of whether a first voltage at the input 106 is greater than a second voltage at the output 108 (e.g., when the field effect transistor 110 is effectively forward biased from source to drain). In several embodiments, the comparator turns on or activates the FET when the voltage at the input is greater than the voltage at the output. In such case, the voltage drop across the ideal diode circuit (e.g., from the input to the output) is minimal. When the gate voltage, referenced to the source, exceeds a turn-on threshold, the FET is fully on and the FET's on-resistance (e.g., resistance from drain to source or resistance from source to drain) is minimal. If the voltage at the output becomes greater than the voltage at the input, then the comparator output and gate coupled thereto are driven low (e.g., to zero) and the FET is turned off or deactivated. In the off-state, the FET prevents the flow of current from the output (drain) to the input (source) and therefore emulates a diode. In one embodiment, the resistance seen in the on-state is 4 milliohms, which provides for very minimal voltage drop across the ideal diode circuit. For example, if the current applied to the ideal diode circuit is 50 amps, then the voltage drop is 200 millivolts. In the off-state, the resistance seen from the drain to the source is increased substantially. In one embodiment, the off-state resistance is approximately one mega ohm or greater.

In some embodiments, the ideal diode circuit 100 can be thought of as a power section 102 coupled to a control circuit 103. In such case, the control circuit 103 is configured to activate the power section when the input voltage is greater than the output voltage by asserting a gate voltage. When the output voltage is greater than the input voltage, the control circuit 103 deactivates the power section by driving the gate voltage to zero. In the illustrated embodiment, the power section 102 includes one FET. In other embodiments, the power section 102 can include multiple FETs coupled together in a parallel configuration.

In the embodiment illustrated in FIG. 1, the control circuit includes a comparator for controlling the ideal diode circuit. In other embodiments, other logic circuitry can be used to control the ideal diode circuit. In several embodiments, FET 110 is a metal oxide field effect transistor (MOSFET). In other embodiments, other FETs can be used. In some embodiments, other transistors can be used.

In one embodiment, the comparator is implemented using an operational amplifier having a non-inverting input coupled to the input of the ideal diode circuit and an inverting input coupled to the output of the ideal diode circuit. In such case, the operation amplifier generates an output signal indicative of whether the voltage at the input of the ideal diode circuit is greater than the voltage at the output of the ideal diode circuit. If the voltage at the input is greater than the voltage at the output, the operational amplifier drives the gate of the field effect transistor high and activates the FET. If, however, the voltage at the output is greater than the voltage at the input, the operational amplifier drives the gate low to deactivate the FET.

Figure 2:
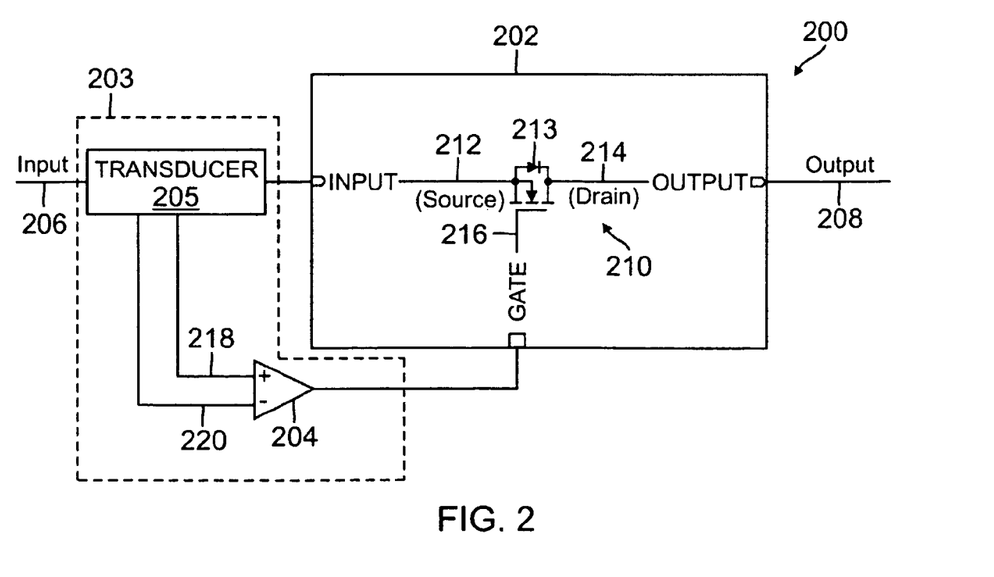
FIG. 2 is a schematic diagram of an ideal diode circuit including a power section and a control circuit for controlling the ideal diode circuit in accordance with an embodiment of the present invention.

FIG. 2 is a schematic diagram of an ideal diode circuit 200 including a power section 202 and a control circuit 203 for controlling the ideal diode circuit in accordance with an embodiment of the present invention. The control circuit 203 includes a comparator 204 coupled to a transducer 205 for providing one or more signals (218, 220) indicative of whether current is flowing through the transducer and the ideal diode circuit 200. The transducer 205 can measure a current flowing therethrough and convert the measurement into one or more differential voltage signals, where the voltage difference is representative of a magnitude of the measured current. The power section 202 includes an input 212, an output 214, a gate input 216, and a FET 210 having a source coupled to the input 212, a drain coupled to the output 214 and a gate coupled to the gate input 216. The ideal diode circuit 200 further includes an input 206 coupled to the transducer 205 and an output 208 coupled to output 214 of the power section 202.

In operation, the comparator 204 generates an output signal indicative of whether a current is flowing into the input 206 and through the transducer 205. In several embodiments, the comparator turns on the FET when the current is flowing into the input. In such case, the voltage drop across the ideal diode circuit (e.g., from the input to the output) is substantially reduced as compared to the voltage drop across a convention diode. In one embodiment, for example, a conventional diode carrying a current of 50 amps has a voltage drop of 1 volt while the ideal diode circuit has a voltage drop of only 200 millivolts.

When the gate voltage, referenced to the source, exceeds a turn-on threshold, the FET is fully on and the FET's on-resistance (e.g., resistance from drain to source or resistance from source to drain) is minimal. In one embodiment, for example, the on-resistance is 4 milliohms. If the current attempts to flow in reverse (e.g., from the output to the input), then the comparator output and gate coupled thereto are driven low (e.g., to zero) and the FET is turned off. In the off-state, the FET prevents the flow of current from the output (drain) to the input (source) and therefore emulates a conventional diode. In the off-state, the resistance seen from the drain to the source is increased substantially. In one embodiment, off-state resistance is approximately one mega ohm or greater.

In the embodiment illustrated in FIG. 2, the control circuit includes a comparator for controlling the ideal diode circuit. In other embodiments, other logic circuitry can be used to control the ideal diode circuit. In several embodiments, FET 110 is a metal oxide field effect transistor (MOSFET). In other embodiments, other FETs can be used. In some embodiments, other transistors can be used.

In one embodiment, the comparator is implemented using an operational amplifier having a non-inverting input and an inverting input where each of the inputs is coupled to the transducer. In such case, the operational amplifier generates an output signal indicative of whether the voltage at a first output of the transducer is greater than the voltage at a second output of the transducer. In such case, the generated signal is also indicative of whether a current is flowing from the input 206 into the transducer 205. If the voltage at the first output of the transducer is greater than the voltage at the second output, the operational amplifier drives the gate of the field effect transistor high and activates the FET. If, however, the voltage at the second output of the transducer is greater than the voltage at the first output, the operational amplifier drives the gate low to deactivate the FET.

In one embodiment, the transducer 205 is coupled in series with the output 208 rather than the input 206 as depicted in the illustrated embodiment.

Figure 3:
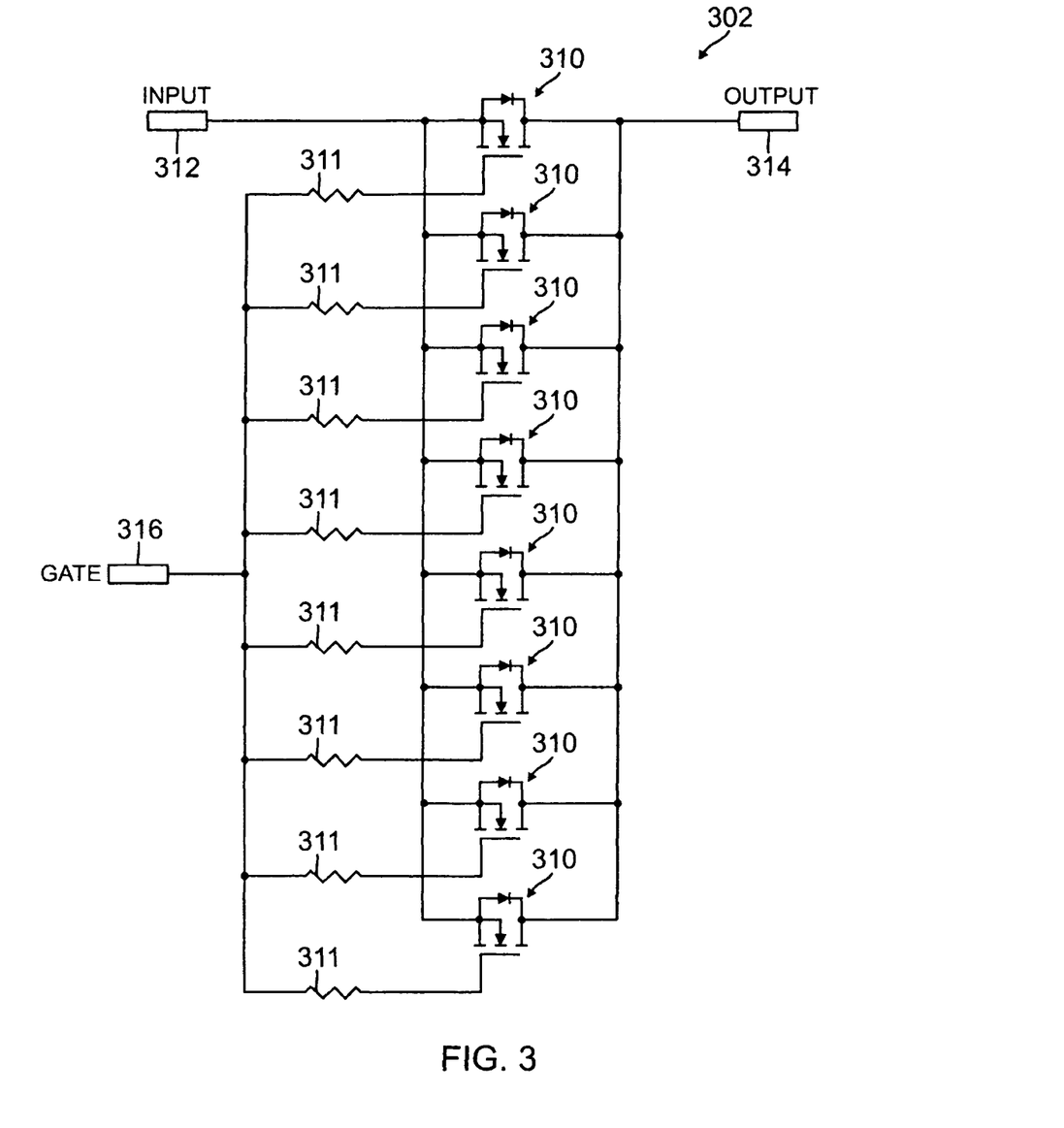
FIG. 3 is a schematic diagram of a power section of an ideal diode circuit including eight field effect transistors in parallel in accordance with an embodiment of the present invention.
Figure 4:
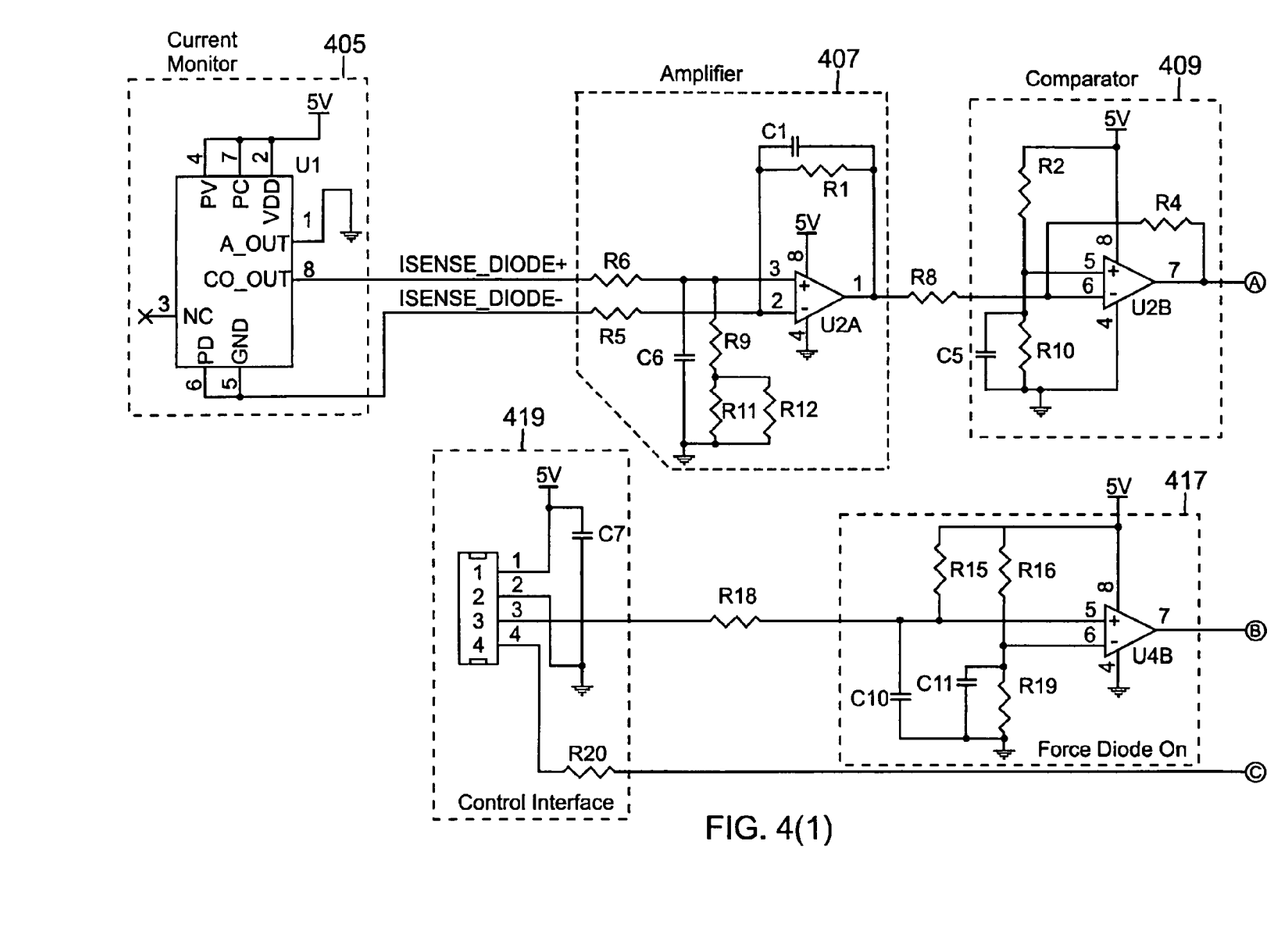

FIG. 3 is a schematic diagram of a power section 302 of an ideal diode circuit including eight field effect transistors 310 in parallel in accordance with an embodiment of the present invention. The power section 302 includes an input 312 coupled to a source of each FET 310, an output coupled to a drain of each FET 310, and a gate input 316 coupled via eight resistors 311 to a gate of each FET 310, where each FET gate is coupled by one resistor 311 to the gate input 316. Using multiple FETs in parallel further reduces the voltage drop from the input 312 to the output 312 as the resistance of each FET is in parallel with the resistances of the other FETs.

In one embodiment, the FETs are MOSFETs having a 4 milliohm on-resistance. In such case, the parallel combination of eight FETs results in an on-resistance of 0.5 milliohms. For a high current application handling 150 amps, the resultant voltage drop is reduced to 80 millivolts. If a conventional diode has a voltage drop of 1 volt, the power dissipated is 150 watts. The ideal diode circuit, on the other hand, has a voltage drop of 80 millivolts corresponding to power dissipation of 12 watts for the given current. The substantially reduced power dissipation represents a 1,250 percent improvement in power dissipation. In comparison, a parallel combination of conventional diodes does not result in a decreased voltage drop across the combination. While the illustrated embodiment shows a power section having eight FETs in parallel, in other embodiments, the number of FETs used can be more than or less than eight. In some embodiments, other configurations of FETs may be appropriate.

FIG. 4(1) to 4(2) is a schematic diagram of an ideal diode control circuit 400 configured to measure current, control an ideal diode circuit, report status, and provide a force-on capability in accordance with an embodiment of the present invention. The ideal diode control circuit 400 includes a current monitor 405 coupled by an amplifier 407 to a comparator 409. The comparator 409 is coupled by a FET to a gate drive circuit 410. The gate drive circuit 410 is coupled to a gate terminal output 411 and an input terminal 412. The gate drive circuit 410 is also coupled by a status reporting circuit 415 to a control interface 419. The control interface 419 is coupled to an override circuit 417 for forcing the ideal diode circuit into the on-state. The override circuit 417 is coupled by a FET to the gate drive circuit 410 and to the status reporting circuit 415. The control interface 419 enables an external device to control and/or monitor an ideal diode circuit.

In operation, the current monitor or transducer 405 measures a current flowing into the input of an ideal diode circuit/switch (ideal diode circuit not shown) and generates a differential signal indicative of the measured current. The amplifier 407 amplifies the signal indicative of the measured current. The comparator 409 compares the amplified current to a predetermined threshold determined by the ratio of R2 and R10. When the amplified current exceeds the predetermined threshold, the gate drive circuit 410 asserts a gate output signal provided at the gate terminal output 411. When the current drops below the predetermined threshold, the gate drive circuit 410 drives the gate output signal to a non-asserted value (e.g., zero). When the gate output signal is asserted, the ideal diode circuit or power section (not shown) is activated and thus enables forward conduction with minimal voltage drop. When the gate output signal is driven to a non-asserted value, the ideal diode circuit or power section is deactivated and acts as a conventional diode (e.g., high impedance) to prevent the flow of current from the output to the input (see FIG. 2).

The status reporting circuit 415 can report the status of the ideal diode circuit to an external device. In several embodiments, the reported status is indicative of whether the ideal diode circuit is enabled (on-state) to permit current flow in a forward direction (e.g., from source to drain), or disabled (off-state) to prevent current flow in a reverse direction (e.g., from drain to source). The status reporting circuit 415 provides a signal indicative of the status of the ideal diode circuit to the control interface 419. The control interface 419 enables communication with any number of external devices to provide status thereto or to enable override control via the override circuit 417. The override circuit 417 can activate the ideal diode circuit or power section regardless of the direction or quantity of current flowing into the ideal diode circuit or power section. The override circuit 417 can effectively be used to force the ideal diode circuit into the on-state by overriding the input signal to the gate drive 410. The override circuit 417 can be operated remotely via the control interface 419 by external logic circuitry (not shown), such as, a computer, relay circuitry, or other control logic circuitry. In one embodiment, the override circuit 417 is used to deactivate or switch off the ideal diode circuit.

In some embodiments, the ideal diode circuit is used to control the flow of current from a battery, such as, for example, a lithium-ion battery. The ideal diode circuit can be controlled by an external circuit that is coupled by the control interface to the override circuit 417. In one such embodiment, the external circuit is a circuit for charging the battery. In several embodiments, the ideal diode circuit is operated as a switch to enable both the flow of current in one direction (e.g., forward conduction, from the battery) and the flow of current in the opposite direction (e.g., reverse conduction) for charging of the battery at other times. In a number of embodiments, this external ideal diode control system can be useful in preventing overcharging and/or preventing related overheating problems associated with charging batteries (e.g., lithium-ion batteries).

In one embodiment, the transducer is a CSA-1V Hall Effect sensor manufactured by Sentron AG of Switzerland. In one embodiment, the gate driver circuit is a DCP010512B DC-to-DC converter made by Texas Instruments of Dallas, Tex.

FIG. 5(1)-5(3) is a schematic diagram of an ideal diode control circuit 500 configured to measure current, report the measured current, control an ideal diode circuit, report control status, and provide a force-off capability in accordance with an embodiment of the present invention. The ideal diode control circuit 500 includes a current monitor 505 coupled to an amplifier 507. A current reporting circuit 508 is coupled to the amplifier 507 and is configured to report the magnitude of current measured by the current monitor 505. A comparator 509 is also coupled to the amplifier 507 and is configured to output a signal indicative of whether the current provided from the amplifier is above a threshold. The output of the comparator 509 is coupled to both a gate drive circuit 510 and a disable or "force diode off" circuit 517. The disable or force off circuit 517 is coupled to a control interface 519. An external device can provide a disable or "diode off ctrl" signal to the disable circuit 517. If the disable signal is asserted, the disable circuit 517 can pull the output of the comparator 509 down to ground, effectively disabling or turning off the gate drive circuit 510.

The gate drive circuit 510 includes a DC-to-DC converter (U2) coupled to a multi-position FET (Q2) acting as a switch. The gate drive circuit 510 can provide a gate output signal capable of driving multiple FETs 520, configured as ideal diodes, in a power section (see, for example, FIG. 3). A status reporting circuit 515 is coupled to the output of the gate drive circuit 510 and is configured to report the status (on-state or off-state) of the power section FETs 520. The status is reported via the control interface 519 to an external device. The status reporting circuit 515 includes a status LED (D4) that provides a visual indication at the ideal diode control circuit of the status of the ideal diode control circuit 500. The status reporting circuit 515 also includes an optical isolator (ISO1) for providing isolation between the control interface 519 and the power section 520. The isolator can prevent damage to external devices by transients in the load. In other embodiments, the optical isolators can be replaced other suitable isolators.

A noise suppression circuit 522 is also coupled to the output of the gate drive circuit 510. The DC-to-DC converter of the gate drive circuit can operate at high frequencies and can therefore generate significant noise. The noise suppression circuit 522 can reduce or eliminate such noise. The FET power section 520 is coupled to a transient suppression circuit 524 for suppressing transients from the load (not shown).

In operation, the current monitor or transducer 505 measures a current flowing into the input of an ideal diode circuit/switch (ideal diode circuit not shown) and generates a differential signal indicative of the measured current. The amplifier 507 amplifies the signal indicative of the measured current. The current reporting circuit 508 generates a signal indicative of a magnitude of the measured current. The magnitude signal can be provided via the control interface 519 to an external device. The measured current is also supplied to the comparator 509 which compares the amplified current to a predetermined threshold determined by the ratio of R3 and R10. When the amplified current exceeds the predetermined threshold, the gate drive circuit 510 asserts a gate output signal which is provided to the FET power section 520. When the current drops below the predetermined threshold, the gate drive circuit 510 drives the gate output signal to a non-asserted value (e.g., zero). When the gate output signal is asserted, the ideal diode circuit or power section (not shown) is activated and thus enables forward conduction with minimal voltage drop. When the gate output signal is driven to a non-asserted value, the ideal diode circuit or power section is deactivated and acts as a conventional diode (e.g., high impedance) to prevent the flow of current from the output to the input (see FIG. 2).

The status reporting circuit 515 can report the status of the ideal diode circuit to an external device. In several embodiments, the reported status is indicative of whether the ideal diode circuit is enabled (on-state) to permit current flow in a forward direction (e.g., from source to drain), or disabled (off-state) to prevent current flow in a reverse direction (e.g., from drain to source). The status reporting circuit 515 provides a signal indicative of the status of the ideal diode circuit to the control interface 519. The control interface 519 enables communication with any number of external devices to provide status thereto or to turn off the ideal diode(s) via the disable circuit 517. The disable circuit 517 can deactivate the ideal diode circuit or power section regardless of the direction or quantity of current flowing into the ideal diode circuit or power section. The disable circuit 517 can effectively be used to force the ideal diode circuit into the off-state by overriding the input signal provided to the gate drive circuit 510. The disable circuit 517 can be operated remotely via the control interface 519 by external logic circuitry (not shown), such as, for example, a computer, relay circuitry, or other control logic circuitry. In one embodiment, the disable circuit is replaced with a force-on circuit which can force the gate drive circuit to activate the ideal diode circuit regardless of any current flowing there through. In one embodiment, the disable circuit 517 is used in conjunction with changing a battery as described above for FIG. 4(1)-4(2).

In the embodiment illustrated in FIG. 5(1)-5(3), the transducer is a CSA-1V Hall Effect sensor manufactured by Sentron AG of Switzerland. In one embodiment, the gate driver circuit is a DCP010512B DC-to-DC converter made by Texas Instruments of Dallas, Tex. In other embodiments, other current sensors and voltage converters can be used.

Figure 5:
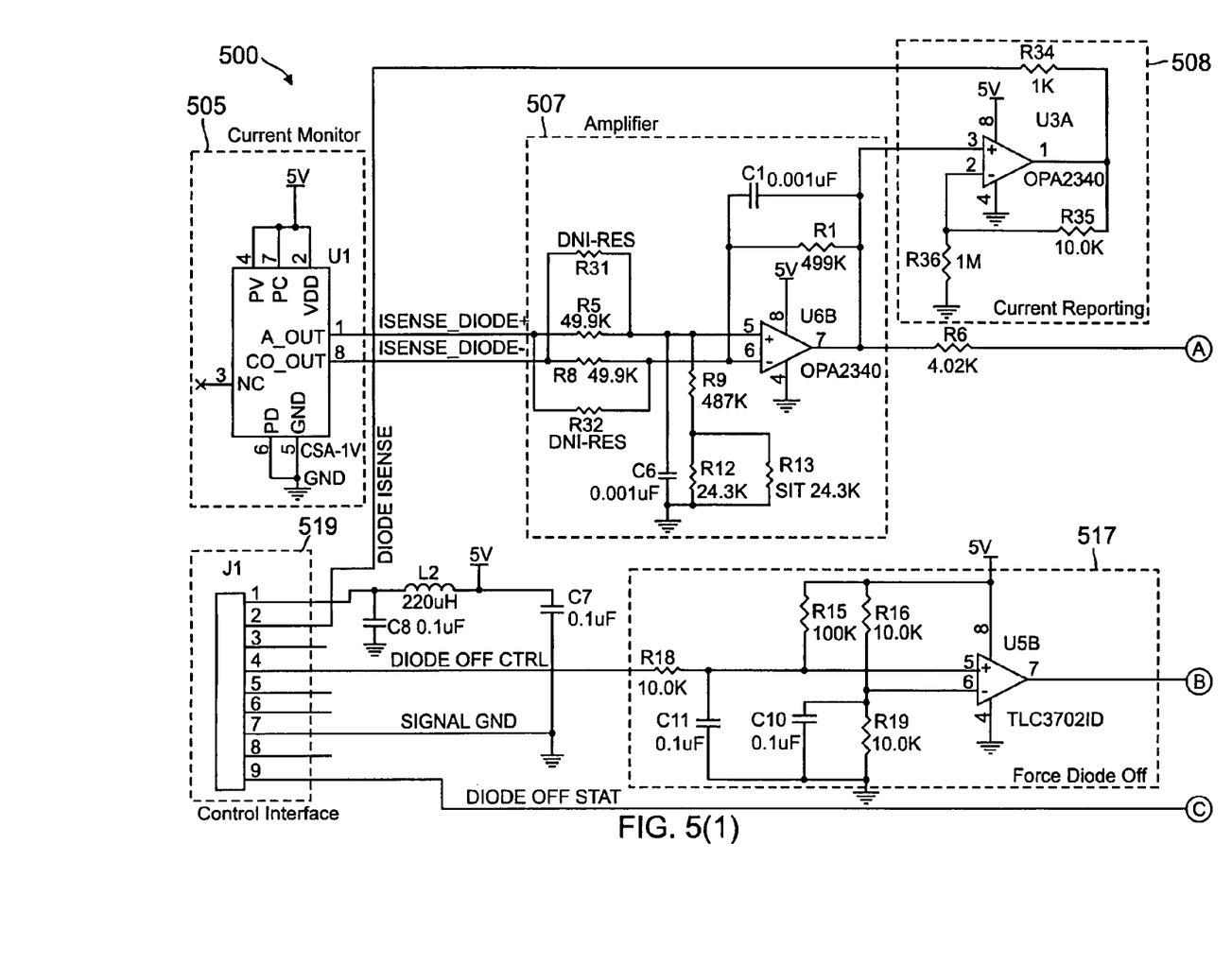

While specific components are depicted in FIGS. 5(1)-5(3), those skilled in the art will understand that other suitable components can be substituted for the depicted components.

Figure 6:
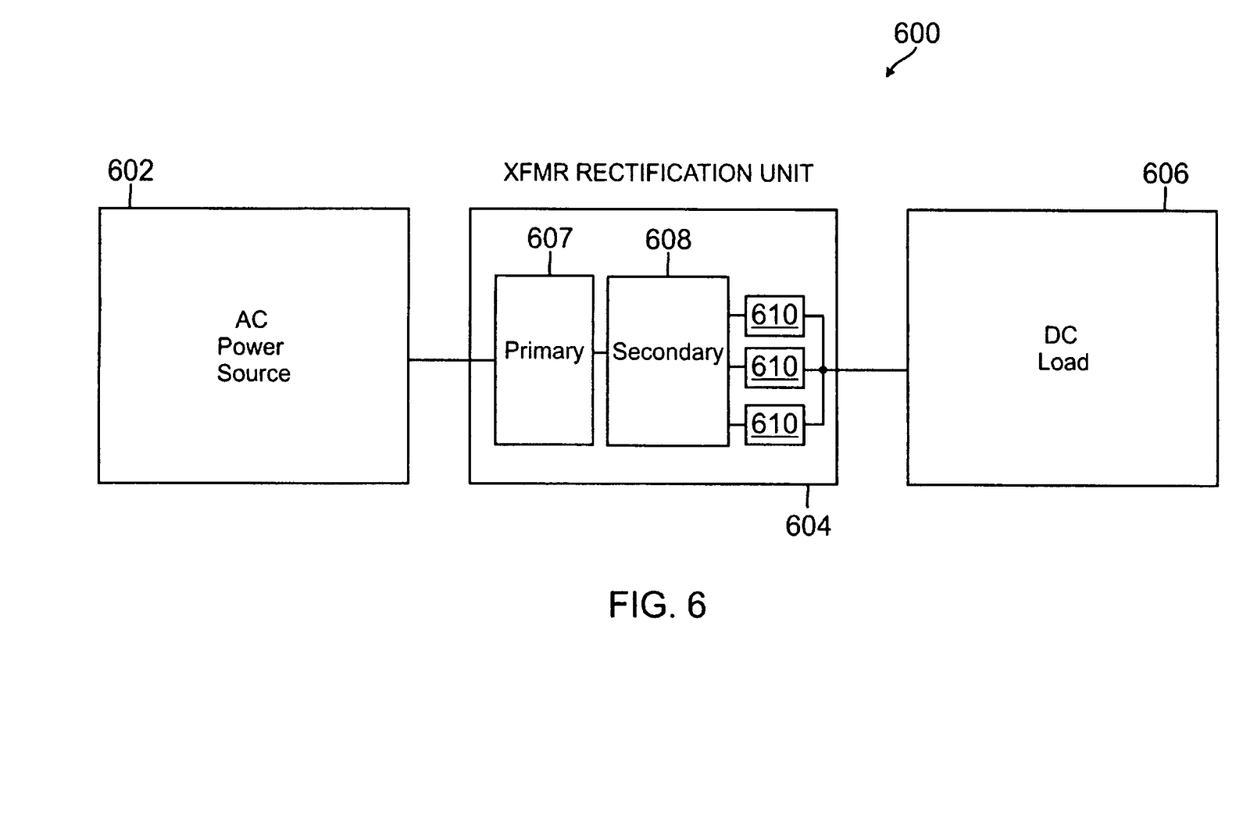
FIG. 6 is a schematic block diagram of a power system including a transformer rectification unit having a plurality of ideal diode circuit units in accordance with an embodiment of the present invention.

FIG. 6 is a schematic block diagram of a power system 600 including a transformer rectification unit 604 having a plurality of ideal diode circuit units 610 in accordance with an embodiment of the present invention. The power system 600 further includes an alternating current (AC) power source 602 coupled by the transformer rectification unit 604 to a direct current (DC) load 606. The transformer rectification unit 604 includes a primary winding 607 electromagnetically coupled to a secondary winding 608. The secondary winding 608 is coupled with multiple ideal diode circuit units 610. Each ideal diode circuit unit 610 can include a number of ideal diode circuits coupled in parallel (e.g., see FIG. 3) and one or more control circuits.

Transformer rectification units (TRUs) are used to convert AC into DC and are commonly used in aircraft electrical systems to charge emergency batteries or to provide DC power for other uses. Such TRUs are well known in the art as indicated in U.S. Pat. No. 6,256,213, the content of which is expressly incorporated by reference herein in its entirety, to Illingsworth describing a means for transformer rectification unit regulation. In aircraft electrical systems, power can be distributed using DC or AC (single, two or three phase) systems, or combinations thereof. In several embodiments, TRUs can be used to generate DC power at 28 volts, 26 volts or 270 volts. In one embodiment, a TRU generates DC power in the range of 11 to 28 volts. In most embodiments, the AC power source coupled to a TRU operates at 115 volts and at a frequency of 400 hertz. In other embodiments, the AC power sources operate at other voltages and other frequencies. In several embodiments, the DC loads coupled to TRUs can include batteries or other aircraft DC loads. In one embodiment, the AC power sources can include generators, ram air turbines and/or external AC power sources.

Transformer rectification units include a number of rectifying diodes for rectifying AC voltage. Power dissipated in rectifying diodes can be substantial and can severely limit the efficiency of TRUs. Due to excessive heat caused by the power dissipation in rectifying diodes, TRUs may need to be fitted with specialized heat sinks and/or cooling fans. Use of ideal diode circuits in place of traditional rectifying diodes significantly reduces the power dissipation of a TRU. In addition, use of ideal diode circuits can enable operation of TRUs without specialized heat sinks or cooling fans.

In one embodiment, for example, one or more ideal diode circuits is used to replace a conventional power diode carrying a current ranging from 50 to 400 amps. In one such case, the power diode has a voltage drop of 1.2 volts. The power dissipation associated with the power diode could thus be as high as 480 watts. Using an ideal diode circuit having the eight FET power stage of FIG. 3, for example, with 0.5 milliohms on-resistance, the voltage drop is reduced to 0.2 volts and the corresponding power dissipation to 80 watts. The use of the ideal diode therefore results in six times less power dissipated, or equivalently, increased efficiency of 6,000 percent.

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed is:

1. A circuit for emulating an ideal diode, the circuit comprising:
    plurality of field effect transistors coupled in parallel, each comprising a source, a drain, a gate, and a body diode, wherein each of the plurality of field effect transistors is substantially the same;
    a current sensor configured to measure the current flowing into the source of each. of the plurality of field effect transistors and to generate a voltage corresponding to the measured current;
    a comparator comprising a first input and a second input coupled to the current sensor and an output coupled to the gate of each of the plurality of field effect transistors; and
    a status reporting circuit coupled to the comparator,
    wherein the comparator is configured to activate each of the plurality of field effect transistors when the voltage generated by the current sensor is greater than a predetermined threshold,
    wherein the status reporting circuit is configured to monitor a voltage of the output of the comparator and to generate a signal indicative of whether the plurality of field effect transistors are activated or deactivated based on the monitored voltage, and
    wherein the body diode comprises an anode coupled to the source and a cathode coupled to the drain.

2. The circuit of claim 1, wherein each of the plurality of field effect transistors comprises a MOSFET.

3. The circuit of claim 2, wherein the MOSFET has an on-resistance of 4 milliohms.

4. The circuit of claim 1:
    wherein the comparator is an operational amplifier;
    wherein the first input is a non-inverting input to the operational amplifier; and
    wherein the second input is an inverting input to the operational amplifier.

5. The circuit of claim 1, further comprising a plurality of resistors, each resistor coupled between the comparator and the gate of each of the plurality of field effect transistors.

6. The circuit of claim 1, wherein the comparator is configured to collectively activate the plurality of field effect transistors.

7. The circuit of claim 1, wherein the plurality of field effect transistors each have a same on-resistance.

8. A circuit for emulating an ideal diode, the circuit comprising:
    at least one field effect transistor comprising a source, a drain, a gate, and a body diode;
    an input;
    an output coupled to the drain;
    a control circuit comprising a current sensor configured to measure the current flowing into the source, and a comparator coupled to the gate; and
    a status reporting circuit coupled to the comparator,
    wherein the comparator is configured to activate the at least one field effect transistor when the measured current flowing into the source is greater than a predetermined threshold,
    wherein the status reporting circuit is configured to monitor an output voltage of the control circuit and to generate a signal indicative of whether the at least one field effect transistor is activated or deactivated based on the monitored output voltage, and
    wherein the body diode comprises an anode coupled to the source and a cathode coupled to the drain.

9. The circuit of claim 8, wherein the at least one field effect transistor comprises a MOSFET.

10. The circuit of claim 8, wherein the comparator comprises an operational amplifier coupled to the current sensor.

11. The circuit of claim 8, wherein the current sensor is configured to generate a signal indicative of a current flowing into the source.

12. The circuit of claim 8, wherein the at least one field effect transistor comprises a plurality of field effect transistors coupled in parallel.

13. The circuit of claim 12:
wherein each of the plurality of parallel field effect transistors comprises a source, a drain, a gate, and a body diode;
wherein the sources of the plurality of parallel field effect transistors are coupled together;
wherein the drains of the plurality of parallel field effect transistors are coupled together; and
wherein the gates of the plurality of parallel field effect transistors are coupled together.

14. The circuit of claim 8, wherein the comparator is configured to generate a signal indicative of whether the current flowing into the source is greater than the predetermined threshold, and
wherein the control circuit further comprises:
a disable circuit coupled to the comparator, wherein the disable circuit is configured to deactivate the at least one field effect transistor independent of the signal generated by the comparator.

15. The circuit of claim 8, wherein the comparator is configured to generate a signal indicative of whether the current flowing into the source is greater than the predetermined threshold.

16. The circuit of claim 8, wherein the comparator is configured to generate a signal indicative of whether the current flowing into the source is greater than the predetermined threshold, and
wherein the control circuit further comprises:
an amplifier coupled in series between the current sensor and the comparator; and
a gate drive circuit coupled to the comparator,
wherein the gate drive circuit is configured to generate a signal, based on the signal generated by the comparator, that is applied to the gate of the at least one field effect transistor.

17. The circuit of claim 8:
wherein the at least one field effect transistor comprises a plurality of field effect transistors coupled in parallel; and
wherein each of the plurality of parallel field effect transistors comprises a source, a drain, a gate, and a body diode;
the ideal diode circuit further comprising a plurality of resistors, each resistor coupled between the comparator and the gate of each of the plurality of field effect transistors.

18. A circuit for emulating an ideal diode, the circuit comprising:
at least one field effect transistor comprising a source, a drain, a gate, and a body diode, wherein the body diode comprises an anode coupled to the source and a cathode coupled to the drain;
an input;
an output coupled to the drain; and
a control circuit comprising:
a current sensor configured to measure the current flowing into the source;
a comparator coupled to the gate and configured to generate a signal indicative of whether the current flowing into the source is greater than a predetermined threshold;
an amplifier coupled in series between the current sensor and the comparator;
a gate drive circuit coupled to the comparator and configured to generate a signal, based on the signal generated by the comparator, that is applied to the gate of the at least one field effect transistor, and to activate the at least one field effect transistor when the measured current flowing into the source is greater than a predetermined threshold;
a disable circuit coupled to the comparator, wherein the disable circuit is configured to deactivate the at least one field effect transistor based on a disable signal;
a status reporting circuit coupled to the comparator, wherein the status reporting circuit is configured to generate a status signal indicative of a status of the at least one field effect transistor; and
a control interface coupled to the disable circuit and the status reporting circuit, wherein the control interface is configured to:
receive the disable signal from an external device; and
output the status signal to the external device.

19. A power system including a transformer rectification unit, the power system comprising:
an alternating current power source coupled to the transformer rectification unit;
a direct current load coupled to the transformer rectification unit; and
the transformer rectification unit comprising:
a primary winding;
a secondary winding electromagnetically coupled with the primary winding; and
at least one ideal diode circuit coupled to the secondary winding, the at least one ideal diode circuit comprising a current sensor, a comparator, and at least one field effect transistor coupled to the comparator; and
a status reporting circuit coupled to the comparator,
wherein the at least one field effect transistor is configured to rectify energy from the alternating current power source by dissipating energy across a body diode of the at least one field effect transistor, and
wherein the current sensor is configured to measure the current flowing into a source of the at least one field effect transistor,
wherein the comparator is configured to activate the at least one field effect transistor when the measured current flowing into the source is greater than a predetermined threshold, and
wherein the status reporting circuit is configured to monitor an output voltage of the comparator and to generate a signal indicative of whether the at least one field effect transistor is activated or deactivated based on the monitored output voltage.

20. The power system of claim 19, wherein the comparator is configured to activate the at least one field effect transistor when the measured current exceeds a predetermined threshold 21. The power system of claim 20:
wherein the at least one field effect transistor comprises a plurality of field effect transistors coupled in parallel; and
wherein each of the plurality of parallel field effect transistors comprises a source, a drain, a gate, and a body diode;

the system further comprising a plurality of resistors, each resistor coupled between the comparator and the gate of each of the plurality of field effect transistors.

22. The power system of claim 20:

wherein the at least one field effect transistor comprises a plurality of field effect transistors coupled in parallel;

wherein each of the plurality of parallel field effect transistors comprises a source, a drain, a gate, and a body diode;

wherein the sources of the plurality of parallel field effect transistors are coupled together;

wherein the drains of the plurality of parallel field effect transistors are coupled together; and wherein the gates of the plurality of parallel field effect transistors are coupled together.

23. The power system of claim 22:

wherein the secondary winding is coupled to the sources of the plurality of parallel field effect transistors; and wherein the direct current load is coupled to a drains of the plurality of parallel field effect transistors.

24. The power system of claim 19, wherein the at least one field effect transistor is connected to the secondary winding.

25. A circuit for emulating an ideal diode, the circuit comprising:

at least one field effect transistor comprising a source, a drain, a gate, and a body diode the body diode comprising an anode coupled to the source and a cathode coupled to the drain;

an input;

an output coupled to the drain; and a control circuit comprising:

a current sensor configured to measure the current flowing into the source; and a comparator coupled to the gate and configured to activate the at least one field effect transistor when the measured current flowing into the source is greater than a predetermined threshold;

a disable circuit coupled to the comparator, wherein the disable circuit is configured to deactivate the at least one field effect transistor based on a disable signal;

a status reporting circuit coupled to the comparator, wherein the status reporting circuit is configured to generate a signal indicative of a status of the at least one field effect transistor; and a control interface coupled to the disable circuit and the status reporting circuit, wherein the control interface is configured to:

receive the disable signal from an external device; and output the status signal to the external device.

* * * * *

UNITED STATES PATENT AND TRADEMARK OFFICE
CERTIFICATE OF CORRECTION

PATENT NO. : 8,988,912 B2  
APPLICATION NO. : 12/257341  
DATED : March 24, 2015  
INVENTOR(S) : Farshid Tofigh et al.

Page 1 of 1

It is certified that error appears in the above-identified patent and that said Letters Patent is hereby corrected as shown below:

On the Title Page
(57) Abstract, line 5        Delete "diode, an",

​                             Insert --diode; an--

In the Claims
Col. 10, line 9,             Delete "each. of",
Claim 1

​                             Insert --each of--

Col. 13, line 19,            Delete "to a drains",
Claim 23

​                             Insert --to a drain--

Signed and Sealed this  
Sixteenth Day of August, 2016

Michelle K. Lee  
*Director of the United States Patent and Trademark Office*